June 13, 1967 HIRO MORIYASU 3,325,742
HYBRID AMPLIFIER CIRCUIT
Filed Aug. 6, 1963
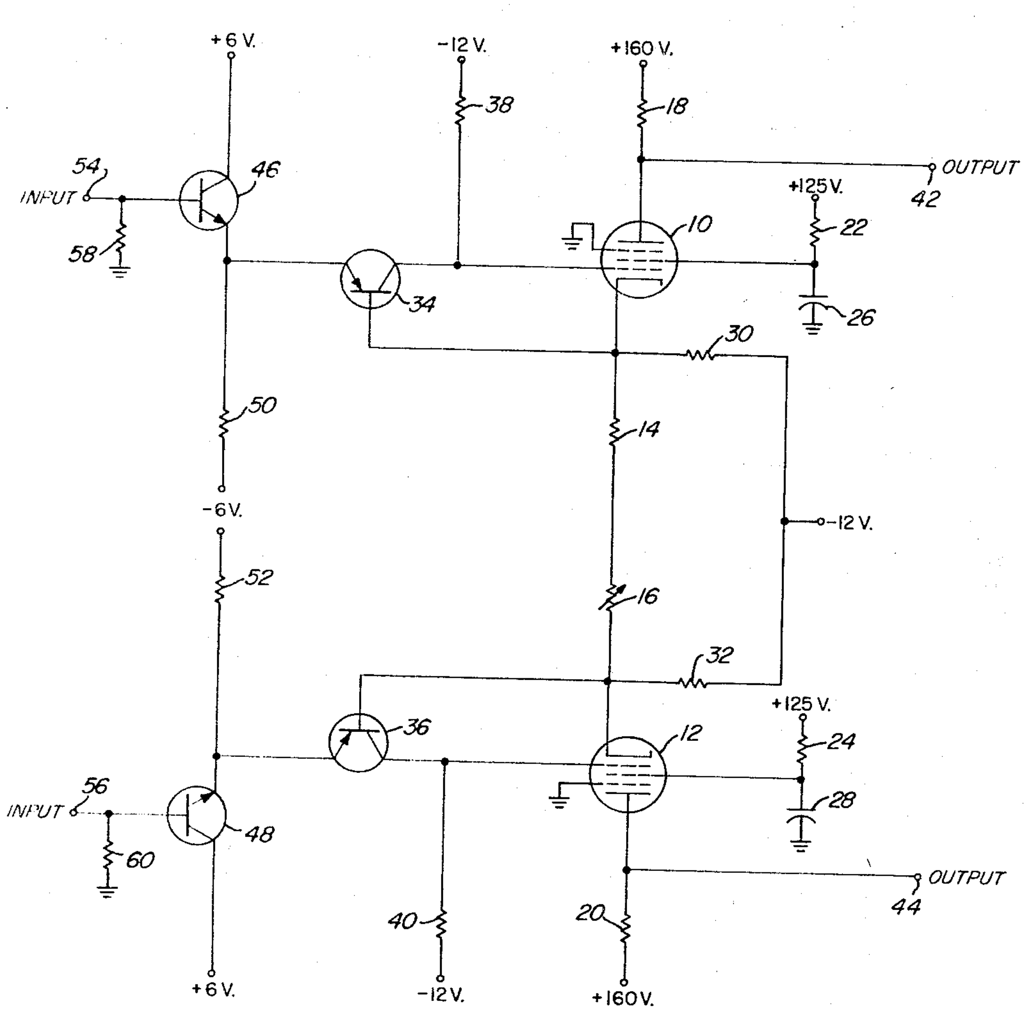
HIRO MORIYASU
INVENTOR.
BY
BUCKHORN, BLORE, KLARQUIST & SPARKMAN
ATTORNEYS

United States Patent Office 3,325,742
Patented June 13, 1967

3,325,742
HYBRID AMPLIFIER CIRCUIT
Hiro Moriyasu, Portland, Oreg., assignor to Tektronix, Inc., Beaverton, Oreg., a corporation of Oregon
Filed Aug. 6, 1963, Ser. No. 300,250
7 Claims. (Cl. 330—3)

The subject matter of the present invention relates generally to electrical signal amplifiers, and in particular to hybrid amplifier circuits in which a transistor is employed to control the input signal to an electron tube in order to compensate for changes in the mutual conductance of such tube. This compensation is accomplished by connecting the base to collector circuit of such transistor in a negative feedback path from the cathode to the control grid of such tube and so that the collector to base voltage of the transistor is employed as the grid to cathode bias voltage of the tube. By compensating for the effect of dynamic changes in the mutual conductance of the tube, the transistor of the present hybrid amplifier allows larger amplitude signals to be amplified without distortion, or enables signals of the same amplitude to be amplified over a greater range of frequencies without distortion.

The hybrid amplifier of the present invention is especially useful when employed in the vertical amplifier of a cathode ray oscilloscope. In this embodiment of the invention the hydrid amplifier may be connected as a push-pull amplifier. However, it should be understood that the present hybrid amplifier may also be connected as a single-ended amplifier circuit if desired. In addition to increased linearity over a greater frequency band pass and greater output signal swings, the hybrid amplifier circuit of the present invention has several other advantages over conventional amplifiers. Thus, the present hybrid amplifier achieves stability without the use of large resistances in the cathode circuit of the electron tube employed in such amplifier and therefore reduces the power supply requirements over that of conventional circuits employing such large resistances or "long tailed" cathodes. Heater voltage fluctuations of the tube are compensated for and cathode interface effects are reduced in the present amplifier. In addition, the gain stability of the amplifier has a greater lifetime than that of previous amplifier circuits.

It is therefore one object of the present invention to provide an improved amplifier circuit of increased linearity over larger ranges of frequency and greater amplitude signals.

Another object of the invention is to provide an improved hybrid amplifier circuit which increases its linear response by employing a semiconductor device to compensate for changes in the mutual conductance of a vacuum tube employed in such circuit.

A further object of the present invention is to provide an improved hybrid amplifier circuit which achieves gain stability for a longer lifetime without the use of large resistances in the cathode circuit of such amplifier so that the power supply requirements for such amplifier are reduced.

An additional object of the present invention is to provide an improved hybrid amplifier circuit which compensates for any fluctuation of heater voltage of an electron tube employed in such circuit and which reduces cathode interface effects.

Other objects and advantages of the present invention will become apparent after referring to the following detailed description of a preferred embodiment thereof and to the attached drawings of which:

The figure is a schematic diagram of one embodiment of the hybrid amplifier circuit of the present invention.

As shown in the figure, one embodiment of the hybrid amplifier of the present invention is connected as a push-pull amplifier including a pair of electron tubes 10 and

12 which may be pentode vacuum tubes of the E55L type having their cathodes connected together through a common coupling impedance. The cathode coupling impedance includes a fixed coupling resistor 14 of 68 ohms connected in series with a variable coupling resistor 16 of 50 ohms which is adjusted to change the gain of the push-pull amplifier. The anodes of the vacuum tubes 10 and 12 are both connected to sources of positive D.C. supply voltage through load resistors 18 and 21, respectively, of 12 kilohms. Thus, the tubes are connected as common cathode amplifiers. The screen grids of the tubes 10 and 12 are connected to suitable sources of positive D.C. bias voltage through decoupling networks including resistors 22 and 24 of 100 ohms and capacitors 26 and 28 of 1 microfarad, while the suppressor grids of such tubes are grounded. A pair of cathode bias resistors 30 and 32 of 280 ohms are connected from the cathodes of tubes 10 and 12, respectively, to a source of negative D.C. supply voltage.

A pair of transistors 35 and 36 which may be of the PNP type 2N769 have their outputs connected to the inputs of vacuum tubes 10 and 12, respectively, with the collectors of such transistors connected to the control grids of such tubes and the bases of such transistors connected to the cathodes of such tubes. A pair of load resistors 38 and 40 of 500 ohms are connected between the collectors of transistors 34 and 36, respectively, and sources of negative D.C. supply voltage. Thus, the transistors 34 and 36 are connected as common base amplifiers so that input signals applied to the emitters of such transistors are transmitted to their outputs at the collectors of such transistors and applied directly to the control grids of the vacuum tubes 10 and 12. The amplified output signals produced by tubes 10 and 12 are transmitted to a pair of output terminals 42 and 44 connected, respectively, across load resistors 18 and 20.

The input signals may be supplied to the emitters of transistors 34 and 36 from a pair of emitter follower amplifier connected transistors 46 and 48 of NPN type 2N2218 which function in a conventional manner and form no part of the present invention. The emitters of the emitter follower transistors 46 and 48 are connected to sources of negative D.C. supply voltage through load resistors 50 and 52, respectively, of 2.2 kilohms while the collectors of such transistors are connected to sources of positive D.C. supply voltage. The bases of the emitter follower transistors are connected to a pair of input terminals 54 and 56 across base bias resistors 58 and 60, respectively. Thus, positive input signals applied to the input terminals 54 and 56 are transmitted as positive signals to the emitters of transistors 34 and 36 and on to the control grids of tubes 10 and 12 before being amplified and produced as negative output signals on output terminals 42 and 44.

From the above, it can be seen that the base to collector circuits of each of the transistors 34 and 36 provide a feedback path for the signal produced on the cathodes of tubes 10 and 12. These feedback signals are inverted by the transistors before being applied to the control grids of the tubes so that they function as negative feedback signals. In this manner the transistor senses any change in the mutual conductance of its associate tube, such as is caused by large amplitude signals, and compensates for such change of mutual conductance by regulating the amount of input signal applied to the control grid of such tubes. In other words, the effect of transistors 34 and 36 is not to change the mutual conductance of the tubes 10 and 12 but rather to increase or decrease the input signals of such tubes to compensate for such variation in mutual conductance in order to increase the linearity of the amplifier circuit.

The changes in mutual conductance of the tubes 10 and 12 cause increases or decreases in plate current through such tubes and thereby change the voltage developed on the cathodes of such tube. These cathode voltages are applied to the base of the transistors 34 and 36 to change the conduction of such transistors so that they increase or decrease the input signals applied to the control grids of the tubes and change the plate currents of such tubes in the opposite direction to the change in plate current caused by the change in mutual conduction of such tubes. Thus when a large amplitude positive signal is applied to the grid of the tube 10 an increase in plate current due to an increase in mutual conductance of such tube will cause the cathode of the tube to go further positive than it would normally without the increase in mutual conductance. This positive voltage is applied to the base of PNP type transistor 34 and tends to reverse bias the emitter junction of such transistor thereby reducing the current flow in its collector and through load resistor 38. As a result the control grid of the tube 10 is driven to a less positive voltage to decrease the plate current in the tube back to a value substantially the same as it would have been if there had been no variation in its mutual conductance. The opposite type of operation results when there is a decrease in signal plate current due to a decrease in mutual conductance of the tube, since this causes the cathode of the tube to go to a less positive voltage which when applied to the base to the transistor 34 tends to forward bias such transistor. This increases the voltage drop across load resistor 38 and drives the control grid of tube 10 more positive to increase the plate current of such tube back to its proper value. It should be noted that the tube current will change until the voltage of the cathode of such tube is of a value so that when applied to the base of transistor 34 it will just slightly forward bias the emitter junction of such transistor. A similar type of compensation operation occurs whenever there is a change in D.C. plate current due to a change in electron emission characteristics of the tube caused, for example, by a variation in cathode heater voltage, to compensate for such change in D.C. plate current.

It will be obvious to those having ordinary skill in the art that various changes may be made in the details of the above described preferred embodiment of the present invention without departing from the spirit of the invention. For example, the electron tubes 10 and 12 may be triodes rather than pentodes, transistors 34 and 36 may be of the NPN type, and the circuit may be connected as a single-ended amplifier merely by eliminating tube 12, transistors 36 and 48 and their associated components, including coupling resistors 14 and 16. Of course, the values of the resistors given in the above description of one embodiment of the invention are merely by way of example and such values will vary with different types of tubes or transistors or different supply voltages. Therefore, the scope of the present invention should only be determined by the following claims.

I claim:

1. A hybrid amplifier circuit comprising:

an electron tube having cathode, anode and control grid electrodes connected as a common cathode amplifier;

a load impedance connected to the anode of said tube and to the output terminal of the amplifier circuit;

a bias resistance connected to the cathode of said tube, said bias resistance being of smaller resistance than said load impedance;

a semiconductor device having emitter, collector and base electrodes with the collector of said device connected to the control grid of said tube, the emitter of said device connected to the input terminal of said amplifier circuit and the base of said device connected to the cathode of said tube across said bias resistor to provide negative voltage feedback for said tube through said device.

2. A hybrid amplifier circuit comprising:

a vacuum tube having cathode, anode and control grid electrodes connected as a common cathode amplifier;

a load impedance connected to the anode of said tube and to the output terminal of the amplifier circuit;

a bias resistor connected to the cathode of said tube, said bias resistor being of smaller resistance than said load impedance; and a transistor having emitter, collector and base electrodes with the collector of said transistor connected to the control grid of said tube, the emitter of said transistor connected to the input terminal of said amplifier circuit and the base of said transistor connected to the cathode of said tube across said bias resistor so that the collector to base voltage of the transistor is employed as the control grid to cathode bias voltage of the tube, and to provide a negative feedback path from said cathode to said base.

3. A hybrid amplifier circuit comprising:

a pentode electron tube connected as a common cathode amplifier;

a first load resistor connected to the anode of said tube and to the output terminal of the amplifier circuit;

a bias resistor connected to the cathode of said tube, said bias resistor being of smaller resistance than said load resistor;

a transistor connected as a common base amplifier with the collector of said transistor connected to the control grid of said tube, the emitter of said transistor connected to the input terminal of said amplifier circuit and the base of said transistor connected to the cathode of said tube across said bias resistor so that the collector to base voltage of the transistor is employed as the control grid to cathode bias voltage of the tube, and to provide a negative feedback path from said cathode to said base;

a second load resistor connected to the collector of said transistor; and bias means for applying D.C. supply voltage across said first and second load resistors and said bias resistor to bias said transistor and said vacuum tube quiescently conductive.

4. A hybrid push-pull amplifier circuit comprising:

a pair of electron discharge devices having cathode, anode and grid electrodes connected as common cathode amplifiers;

a pair of load impedances connected to different ones of the anodes of said discharge devices and to different ones to the output terminals of the amplifier circuit;

a pair of bias resistances connected to different ones of the cathodes of said discharge devices;

a coupling impedance connected between the cathodes of said discharge devices, and a pair of semiconductor devices having emitter, collector and base electrodes with the collectors of said semiconductor devices connected to different ones of the grids of said discharge devices, the emitters of said semiconductor devices connected to the input terminals of said amplifier circuit, and the bases of said devices connected to different ones of the cathodes of said discharge devices to provide negative feedback paths from the cathodes to the bases.

5. A hybrid push-pull amplifier circuit comprising:

a pair of electron tubes having cathode, anode and control grid electrodes connected as common cathode amplifiers;

a pair of load impedances connected to different ones of the anodes of said tubes and to different ones of the output terminals of the amplifier circuit;

a pair of bias resistances connected to different ones of the cathodes of said tubes;

a coupling impedance connected between the cathodes of said tubes; and a pair of transistors having emitter, collector and base electrodes with the collectors of said transistors connected to different ones of the grids of said tubes, the emitters of said devices connected to the input terminals of said amplifier circuit, and the bases of said devices connected to different ones of the cathodes of said tubes so that the collector to base voltages of the devices are employed as the grid to cathode bias voltage of the tubes.

6. A hybrid push-pull amplifier circuit comprising:
a pair of pentode electron tubes connected as common cathode amplifiers;
a pair of load impedances connected to different ones of the anodes of said tubes and to different ones of the output terminals of the amplifier circuit;
a pair of bias resistances connected to different ones of the cathodes of said tubes;
a coupling resistance connected between the cathodes of said tubes; and
a pair of transistors connected as common base amplifiers with the collectors of said transistors connected to different ones of the control grids of said tubes, the emitters of said transistors connected to the input terminals of said amplifier circuit, and the bases of said transistors connected to different ones of the cathodes of said tubes so that the collector to base voltages of the transistors are employed as the grid to cathode bias voltage of the tubes, and to provide negative feedback paths from said cathodes to said bases.

7. A hybrid push-pull amplifier circuit comprising:
a pair of pentode electron tubes connected as common cathode amplifiers;
a first pair of load resistors connected to different ones of the anodes of said tubes and to different ones of the output terminals of the amplifier circuit;

a pair of bias resistors connected to different ones of the cathodes of said tubes;
a coupling resistance connected between the cathodes of said tubes;
a pair of transistors connected as common base amplifiers with the collectors of said transistors connected to a different one of the control grids of said tubes, the emitters of said transistors connected to the input terminals of said amplifier circuit, and the bases of said devices connected to different ones of the cathodes of said tubes so that the collector to base voltages of the transistors are employed as the grid to cathode bias voltage of the tubes, and to provide negative feedback paths from said cathodes to said bases;
a second pair of load resistors connected to a different one of the collectors of said transistors; and
a plurality of sources of D.C. supply voltage connected across said first and second pairs of load resistors and said bias resistances.

References Cited

UNITED STATES PATENTS

| | | | |
|---|---|---|---|
| 2,963,655 | 12/1960 | Schrock | 330—3 |
| 3,185,887 | 5/1965 | Kobbe | 330—15 X |

FOREIGN PATENTS

| | | |
|---|---|---|
| 526,970 | 3/1954 | Belgium. |
| 1,080,607 | 4/1960 | Germany. |
| 773,984 | 5/1957 | Great Britain. |

ROY LAKE, *Primary Examiner.*

NATHAN KAUFMAN, *Examiner.*